US006177235B1

(12) United States Patent
Francou et al.

(10) Patent No.: US 6,177,235 B1
(45) Date of Patent: Jan. 23, 2001

(54) ANTIREFLECTION TREATMENT OF REFLECTIVE SURFACES

(75) Inventors: Jean Marc Francou, Meylan; Aomar Halimaoui, Grenoble; André Schiltz, Saint Ismier, all of (FR)

(73) Assignee: France Telecom, Paris (FR)

( * ) Notice: Under 35 U.S.C. 154(b), the term of this patent shall be extended for 0 days.

(21) Appl. No.: 08/996,684

(22) Filed: Dec. 23, 1997

(30) Foreign Application Priority Data

Dec. 27, 1996 (FR) .................................................. 96 16106

(51) Int. Cl.[7] ...................................................... G03F 7/26
(52) U.S. Cl. .......................... 430/313; 430/950; 216/56; 438/960; 438/964
(58) Field of Search ..................... 430/311, 313, 430/323, 950; 216/56; 438/960, 964, 753

(56) References Cited

U.S. PATENT DOCUMENTS

| | | | |
|---|---|---|---|
| 5,139,974 | * 8/1992 | Sandhu et al. | 438/652 |
| 5,405,802 | * 4/1995 | Yamagata et al. | 438/459 |
| 5,599,759 | * 2/1997 | Inagaki et al. | 502/80 |
| 5,670,298 | * 9/1997 | Hur | 430/318 |
| 5,696,629 | * 12/1997 | Berger et al. | 359/582 |

FOREIGN PATENT DOCUMENTS 20 033   12/1993 (DE) .

OTHER PUBLICATIONS

Menna et al, "Porous Silicon in solar cells: A review and a description of its application as an AR coating" Solar energy Materails and Solar Cells, Apr. 1995.*
Solar Energy Materials and Solar Cells, vol. 37, No. 1, Apr. 1, 1995, pp. 13–24, XP000517030 Menna P. et al.: : Porous Silicon in Solar Cells: A Review and a Description of its Application as an AR Coating *p. 19, Line 2—p. 21, Line 1*.

* cited by examiner

Primary Examiner—Kathleen Duda
(74) Attorney, Agent, or Firm—Fulbright & Jaworski L.L.P.

(57) ABSTRACT

The present invention relates to an improved photolithography process particularly suitable for high-resolution optical lithography techniques using the g, h and i lines of the spectrum of mercury and short-wavelength UV, comprising, prior to deposition of the photosensitive resin on the layer of material to be lithographically patterned, the formation of an antireflective porous layer within the said layer to be lithographically patterned and on the surface of the latter.

10 Claims, 1 Drawing Sheet

ANTIREFLECTION TREATMENT OF REFLECTIVE SURFACES

FIELD OF THE INVENTION

The present invention relates to the photolithographic techniques used in the fabrication of integrated circuits and, more particularly, to high-resolution optical lithography techniques. It relates more particularly to techniques for reducing the undesirable effects of the reflection of optical waves from the layer subjacent to a photosensitive resin.

BACKGROUND OF THE INVENTION

In the steps for fabricating an integrated circuit, layers of semiconductor materials or metallic layers have to be lithographically patterned. These layers can have variable topographies, either plane or in relief. Conventionally, the lithography is carried out by depositing a photosensitive reason on this layer to be lithographically patterned, only certain desired areas of which are sensitized, these being subsequently developed in a developer appropriate to the chemical nature of the resin, thus revealing specific areas of the layer to be lithographically patterned.

This technique is used, for example, to define the level of the gate of an MOS transistor in a layer of polycrystalline silicon. The dimensions of the gates of a transistor are so small that the slightest spurious exposure is deleterious and unacceptable in transistors. This spurious exposure is, in particular, generated by reflection of incident light from the layer to be lithographically patterned subjacent to the resin, increasing the interference effects in the resin and the scattering of the light on the topological variations. Such effects are becoming less and less tolerable because of the dimensions characteristic of submicron technologies.

One approach for reducing the influence of reflected light in photolithography techniques consists in depositing an antireflection layer called an ARC (antireflective coating), which may either be inorganic or organic, directly on the reflective surface. The photosensitive resin in then deposited directly on the ARC layer.

However, the use of these ARCs requires a separate deposition and annealing steps appropriate to these materials. Apart from the expense of the additional equipment necessary for implementing these deposition techniques, it is necessary to add the precautions to be taken for controlling all the parameters of the process of depositing these layers (annealing times, defect minimization, etc.).

In addition to these problems of implementation of the process, ARCs do not have the properties anticipated.

Although they have good antireflective properties, organic ARCs have problems of variation in the thickness of the layers, due in particular to the topography of the surface on which they are deposited. These problems are in fact directly associated with the effect of deposition planarization. Since the thickness of the ARC is not the same over the entire surface, there is a risk of side overetching in the areas where the ARC is thinner during etching of the ARC by a specific plasma.

With regard to inorganic ARCs, these require adjustments and steps additional to the photolithography process, in particular adjustment of their refractive index n and their extinction coefficient k depending on the thicknesses deposited, a specific etching step after exposure and development of the photosensitive resin, and their removal after photoetching is an additional step. On the other hand, they have the advantage over organic ARCs of giving conformal coatings.

Another approach for reducing the reflection of incident light on a reflective layer in a photolithographic etching step is described in U.S. Pat. No. 5,139,974. This approach consists in increasing the roughness of a reflective metal surface so as to increase the absorption of incident light. However, the roughness of the surface is increased by a process which does not guarantee uniformity of the physical state of the surface, a phenomenon which is aggravated by the fact that the layer to be treated includes features and therefore has a surface in relief. This technique modifies the optical properties of the material only in a random manner which is difficult to reproduce.

SUMMARY OF THE INVENTION

One object of the invention is to improve the photolithography step in the fabrication of integrated circuits.

Another object of the invention consists in reducing, or even eliminating, the undesirable effects due to reflection of the incident light from a reflective layer during exposure of a photosensitive resin, while overcoming the drawbacks associated with the approaches of the prior art.

The inventors have demonstrated that the formation of a porous layer within an actual material to be lithographically patterned and on the surface of the latter, so that this novel porous layer lies between the layer of material to be lithographically patterned and the photosensitive resin, allows considerable reduction, of more than 95%, of the reflectivity of the layer to be lithographically patterned, this being achieved in a stable and reproducible manner. Furthermore, the optical properties of the porous absorbent layer can be controlled so as to obtain the desired reflectivity.

Thus, the invention provides an improved photolithography process in the fabrication of integrated circuits, the main characteristic of which is that, prior to deposition of the photosensitive resin, a porous layer is formed within the material to be lithographically patterned and on the surface of the latter, this porous layer being of this same material and having a given thickness.

The material of the layer to be lithographically patterned, subjacent to the photosensitive resin and within which the porous layer is formed, is composed of a conductive material or of a semiconductor material. According to one aspect of the process of the invention, the material is a silicon-based material capable of forming porous silicon. This silicon-based material may have various crystallographic structures, for example it may be amorphous silicon, polycrystalline silicon or single-crystal silicon.

The porosity and the thickness of the layer of porous material formed within the layer to be lithographically patterned are determined depending on the intended optical properties (refractive index and extinction coefficient of the layer of the porous material) or else on the desired reflectivity for a given wavelength. The thickness of the layer of porous material is typically between 200 and 800Å.

The layer of porous material may be formed, within the layer to be lithographically patterned, by a chemical, electrochemical or plasma method, or any other method capable of producing porous material from the material of the layer to be lithographically patterned. Using a chemical method, the preferred method of the invention, the porosity and the thickness of the porous layer are adjusted by varying at least the treatment time or at least the properties of the chemical bath.

According to a preferred way of implementing the invention, a porous silicon layer is formed on the surface of a layer of a silicon-based material using a chemical method.

According to the process of the invention, the photosensitive resin is then deposited and exposed at a given wavelength. As the source, a UV lamp is used in the standard way for the exposure. The exposure of the photosensitive resin may be carried out at a wavelength varying between 193 and 500 nm. The process of the invention is particularly suitable for high-resolution optical lithography techniques using a short UV wavelength, called deep UV, of between 200 and 300 nm, as well as the g, h and i lines of the spectrum of mercury. However, these ranges do not exclude shorter wavelengths capable of sensitizing a resin and of being absorbed by the porous layer.

According to the process of the invention, the resin is then developed and the material of the layer subjacent to the resin to be lithographically patterned is etched. This plasma etching step, which is conventional for etching the material of the layer to be lithographically patterned, has the advantage according to the process of the invention of not requiring an additional specific plasma etching step in order to etch the antireflective layer which the layer of porous material formed previously constitutes. Thus, if the layer is not removed during development of the resin, it will be etched during the etching of the layer to be lithographically patterned without any special action being taken.

The next step concerns the removal of the resin in a conventional manner. The layer of porous material which remains under those parts of the resin constituting the mask used in etching the layer to be lithographically patterned may be easily removed by immersion in a basic solution.

The process of the invention may be easily implemented using various fabrication technologies, such as MOS technology, bipolar technology, BICMOS technology, etc.

According to a preferred way of implementing the invention, the improved photolithography process is particularly suitable for use in etching the polysilicon at of a MOS transistor, which has very small dimensions and for which the slightest spurious exposure is deleterious for the transistor.

Other advantages and characteristics of the invention will appear on reading the detailed description of the ways of implementation and the embodiments of the invention, these being in no way limiting, and on examining the drawings.

DETAILED DESCRIPTION OF THE INVENTION

According to one embodiment of the invention, the layer of material to be lithographically patterned is based on silicon, capable of forming porous silicon. In order to simplify the detailed description of the process of the invention, this will be given in relation to this particular embodiment of the process of the invention. It is clearly understood that the layer to be lithographically patterned may also consist of another semiconductor material or of a conductive material.

As illustrated in FIGS. 1a to 1f, the way of implementing the process of the invention includes, in the first place, the formation, within a layer 3 to be lithographically patterned and on the surface of the latter, a porous layer 4 of the same material as the subjacent layer 3. This porous layer 4 constitutes the antireflective layer of the photolithography process, and this first step constitutes one of the essential characteristics of the process of the invention. This porous silicon layer 3 may be formed from a surface of polycrystalline, single-crystal or amorphous silicon, annealed or non-annealed, etc. The formation of the porous silicon layer may be carried out, according to the process of the invention, using a chemical, electrochemical or plasma method, or any other process capable of producing porous silicon from a silicon-based surface.

According to a preferred embodiment of the invention, the porous silicon layer is produced by a chemical method using a bath containing a mixture of hydrofluoric acid and an oxidising agent such as nitric acid in aqueous solution. The use of a surfactant such as acetic acid or, preferably, a surfactant of the silicone type makes it possible to improve the wetting properties of the bath and therefore the homogeneity of the porous layer.

One advantage of the process of the invention, and particularly of the treatment using a chemical method, is the use of a simple treatment requiring simple and inexpensive equipment. Furthermore, the porous layer thus formed is conformal, thus obviating all the problems associated with the non-conformal deposition of organic ARCs used hitherto, such as the problems of overetching or of variation in the reflectivity with the topography of the surface.

The thickness and porosity of the layer are adjusted by varying the duration of the treatment, such as immersion in the chemical bath, and/or the properties of the chemical bath, such as its composition and its temperature. The porosity and the thickness are adjusted depending on the optical properties desired, in particular the refractive index n and the extinction coefficient k of the antireflective layer, or else on the desired reflectivity at a given resin exposure wavelength. In order to obtain good performance characteristics, the reflectivity is preferably less than 5%.

Figure 1A:
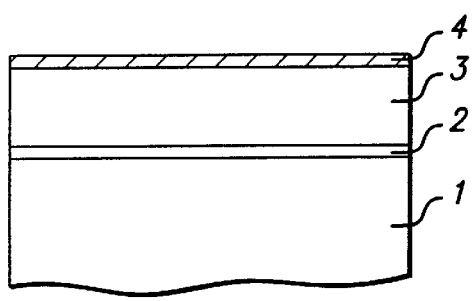
FIGS. 1a to 1f illustrate diagrammatically the steps in the photolithography process of the invention.

The device illustrated in FIG. 1a is obtained, in which a silicon-based layer 3, in particular made of polysilicon, amorphous silicon or single-crystal silicon, has been deposited on a silicon semiconductor substrate 1 covered with a primary oxide layer 2, a thin layer 4 of porous silicon, typically having a thickness of between 200 and 800 Å, having been formed, according to the process of the invention, within and on the surface of this silicon-based layer 3.

Figure 1B:
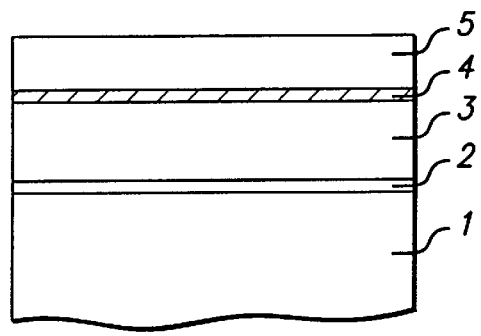

According to the process of the invention, a layer 5 of resin photosensitive to a given wavelength is then deposited on this porous layer 4 using conventional methods, such as deposition using the spin-on technique, deposition by spreading track, etc. This step is illustrated in FIG. 1b.

According to the process of the invention, the next step consists in the exposure of the photosensitive resin for the purpose of forming a mask for etching the subjacent silicon layer. The exposure takes place at a given wavelength. The presence of the antireflective porous layer makes the process of the invention more particularly suited to the high-resolution optical lithography techniques, using the g, h and i lines of the spectrum of mercury, and deep UV, ultraviolet radiation with a short wavelength of between 200 and 300 nm. Conventional wavelengths of between 193 and 436 nm are more particularly used.

According to the process of the invention, a significant decrease in the reflectivity, up to more than 95%, is observed by using a porous layer as the antireflective layer. The table below gives the comparative results of reflectivity measurements between a specimen having a porous silicon layer and a non-treated specimen whose layer subjacent to the resin is a layer of polycrystalline silicon.

| λ | Indicative thickness of porous silicon | Reflectivity measured on the treated specimen | Reference reflectivity measured on the untreated poly-crystalline Si |
|---|---|---|---|
| 248 nm | 350 Å | 10.5% | |
| | 500 Å | 5% | 63.3% |
| | 700 Å | 2.5% | |
| 365 nm | 350 Å | 14% | |
| | 500 Å | 9.5% | 55.5% |
| | 700 Å | 2% | |

The variations in the reflective indices and the extinction coefficients corresponding to the above specimens are as follows:

for λ=248 nm: n=1.6 and k=0.4 to 0.8
for λ=365 nm: n=1.6 and k=0.4 to 0.8.

Within the context of etching the gate of an MOS transistor, which has very small dimensions, no spurious exposure which could be deleterious or redhibitory for the transistor fabricated is observed.

Figure 1C:
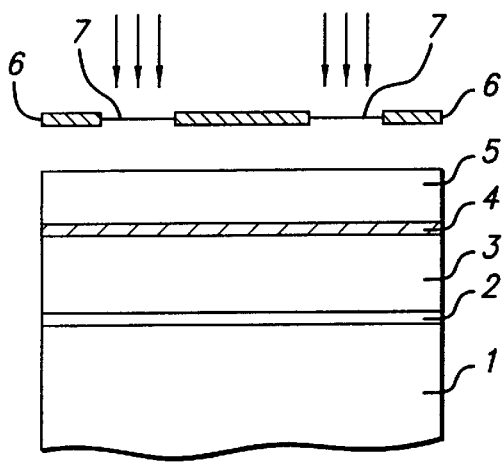

This resin-exposure step is illustrated in FIG. 1c, in which the optical radiation represented by arrows is incident on a mask 6. The optical radiation passes through the unmasked areas 7 in order to expose the resin portions 5 subjacent to these areas 7, thus creating a latent image in the resin. Such a process is conventional.

Figure 1D:
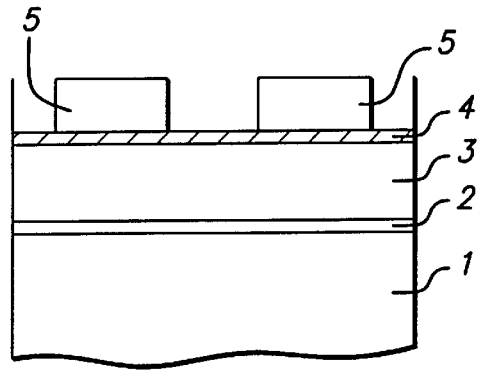
Figure 1E:
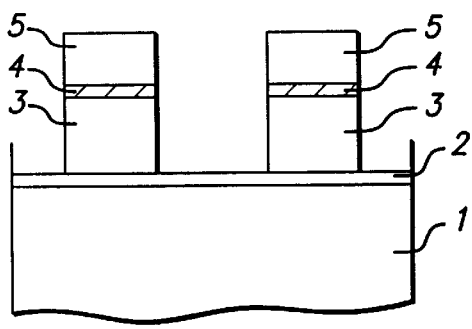

After exposing the resin, the exposed resin portions are developed in a conventional developer bath in order to dissolve away the exposed parts of the resin, if this is a resin called a positive resist, or the unexposed parts, if this is a resin called a negative resist. FIG. 1d illustrates the case of a negative resin. The silicon substrate 1 covered with the primary oxide layer 2 is surmounted by the silicon-based layer 3, the surface of which has been converted into a porous layer 4 to a given thickness. The resin 5 forms a mask on the said porous layer 4 for the purpose of etching the silicon of the layer 3.

Next, the silicon of the layer 3 is plasma etched in a conventional manner. This plasma etching makes it possible to etch the silicon layer 3, whether or not unmasked areas of the porous silicon remain on the surface. If the porous silicon layer 4 is not removed while the resin 5 is being developed, it will be etched, without any particular measure being taken, during the phase of etching the silicon layer 3. The existence of this antireflective layer 4 of porous material therefore does not require additional plasma etching of the said layer 4. This constitutes another advantage of the process of the invention. FIG. 1d illustrates the device thus produced, in which the silicon substrate 1 covered with the primary oxide layer 2 is surmounted by silicon features 3, whatever its crystallographic structure, these features being covered with a porous silicon layer 4 surmounted by the resin mask 5.

Next, the resin is removed in a conventional manner.

Figure 1F:
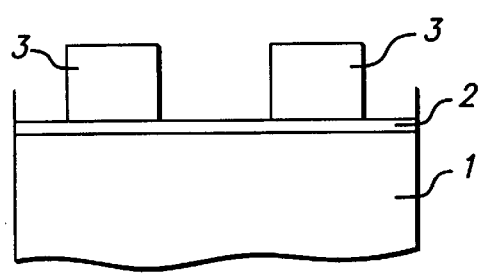

The porous silicon layer 4 which remained under the exposed or unexposed parts of the resin 5, depending on whether the resin used was negative or positive, may easily be removed by immersion in a basic solution. The device illustrated in FIG. 1f is then obtained, in which the silicon substrate 1 covered with the primary oxide layer 2 is surmounted by silicon features 3.

The process of the invention may be implemented in many fabrication technologies, such as MOS technology, bipolar technology, BICMOS technology, etc. Advantageously, it may be used for the photolithography of features having very small dimensions, such as for example the etching of the gate of an MOS transistor, since the significant reduction in the reflection of the incident optical wave on the layer to be lithographically patterned also considerably reduces any spurious exposure generating morphological defects deleterious to the manufacture, for example, of transistors.

What is claimed is:

1. A process for photolithography patterning a first layer subjacent to a second layer of photosensitive resin in the fabrication of integrated circuits, the process comprising:

forming a conformal porous antireflective layer having a given thickness, said antireflective layer obviating overetching or variation in the reflectivity with the topography of the surface causing spurious exposure, within the first layer to be lithographically patterned and on the surface of said layer by any method capable of producing porous material from the material of said layer;

depositing the second layer of photosensitive resin;

exposing the second layer of photosensitive resin to a given wavelength incident on a mask;

developing the patterned second layer of photosensitive resin;

etching the first layer to be lithographically patterned and the optionally remaining antireflective layer without requiring an additional plasma etching step; and removing the second layer of photosensitive resin.

2. The process according to claim 1, characterized in that the material of the first layer to be lithographically patterned is a conductive material or a semiconductor material.

3. The process according to claim 2, characterized in that the material of the first layer to be lithographically patterned in a silicon-based semiconductor material capable of forming porous silicon.

4. The process according to claim 1, characterized in that the porous antireflective layer having a given thickness within and on the surface of the first layer to be lithographically patterned has a porosity and a thickness which can be determined depending on the intended refractive index and extinction coefficient of the porous layer or on the desired reflectivity of the antireflective layer for a given wavelength.

5. The process according to claim 4, characterized in that the thickness of the porous layer is approximately between 200 and 800Å.

6. The process according to claim 1, characterized in that the porous layer within and on the surface of the first layer to be lithographically patterned is obtained by a chemical method using a chemical bath.

7. The process according to claim 6, characterized in that the porosity and the thickness of the porous layer formed by a chemical method within the first layer to be lithographically patterned are adjusted by varying at least one of the following parameters:

a) the treatment time for forming the porous layer; or
b) the composition and temperature of the chemical bath.

8. The process according to claim 7, characterized in that the chemical bath contains a surfactant.

9. The process according to claim 1, characterized in that the wavelength to which the second layer of photosensitive resin is exposed lies within the deep UV range or corresponds to the g, h, or i lines of the spectrum of mercury.

10. The process according to claim 1, in which the first layer subjacent to the second layer of photosensitive resin is a polysilicon layer of a MOS transistor.

* * * * *